(12) United States Patent
Takehata et al.

(10) Patent No.: US 7,037,002 B2
(45) Date of Patent: May 2, 2006

(54) OPTICAL COMPONENT AND METHOD OF MANUFACTURING THE SAME

(75) Inventors: Naoki Takehata, Osaka (JP); Kazunari Nishihara, Osaka (JP); Nobuo Sashinaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 14 days.

(21) Appl. No.: 10/890,252

(22) Filed: Jul. 14, 2004

(65) Prior Publication Data

US 2005/0013562 A1    Jan. 20, 2005

(30) Foreign Application Priority Data

Jul. 17, 2003    (JP)    ............................. 2003-198307

(51) Int. Cl.
*G02B 6/43*    (2006.01)

(52) U.S. Cl. ...................................................... 385/93
(58) Field of Classification Search .................. 385/93
See application file for complete search history.

(56) References Cited

U.S. PATENT DOCUMENTS 6,488,419 B1 *   12/2002   Kato et al. ..................... 385/93
6,739,764 B1 *    5/2004   Ido et al. ....................... 385/92

FOREIGN PATENT DOCUMENTS

JP             63-282710             11/1988

* cited by examiner

*Primary Examiner*—John D. Leo
*Assistant Examiner*—Jerry T Rahll
(74) *Attorney, Agent, or Firm*—Wenderoth, Lind & Ponack, L.L.P.

(57) ABSTRACT

An optical component is provided for optical communication and has a smaller size and a shorter height. The optical component involves a concave package provided by layering ceramic substrates, a groove section formed at a bottom face of this package, an optical semiconductor element provided in this groove section, a cover provided to cover an opening section of the package and a lens formed at the cover.

16 Claims, 7 Drawing Sheets

FIG. 7A – PRIOR ART
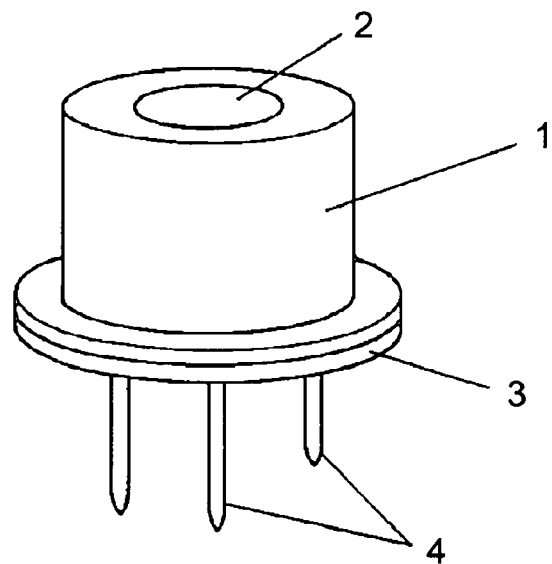
FIG. 7B – PRIOR ART
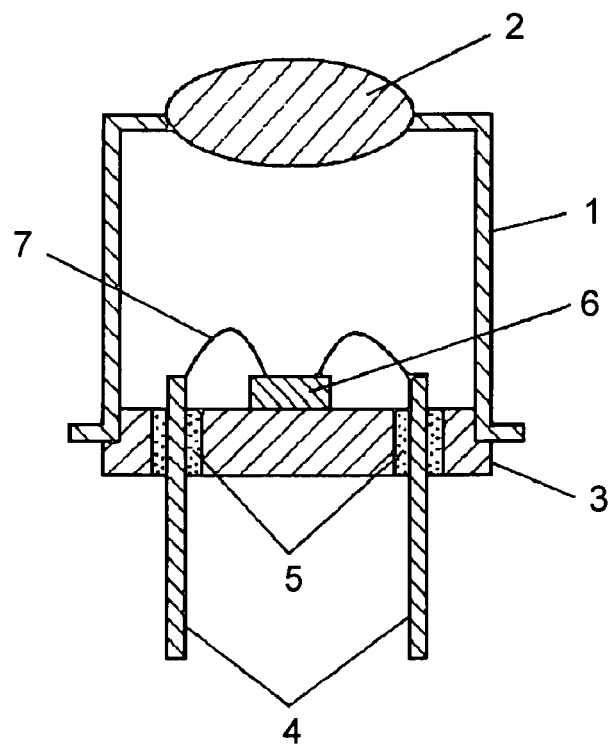

OPTICAL COMPONENT AND METHOD OF MANUFACTURING THE SAME

TECHNICAL FIELD

The present invention relates to an optical component used for optical communication and a method of manufacturing the component.

BACKGROUND OF THE INVENTION

A conventional optical component used for optical communication is shown in FIGS. 7A and 7B.

A light-receiving element module or a light-emitting element module shown in FIGS. 7A and 7B comprises: metallic cap 1; lens 2 bonded to metallic cap 1; metal base 3 on which a chip is mounted; external draw-out electrode 4 for connection from a main face of metal base 3 to a back face; low melting-point glass 5 for hermetically sealing external draw-out electrode 4 to metal base 3; light-emitting element or light-receiving element 6 (e.g., LED, PD); and metal wire 7 for electrically connecting an electrode of element 6 to external draw-out electrode 4.

As metallic cap 1 and metal base 3, an alloy such as Fe—Ni—Co having a plating of Ni—Au or the like on the surface is used for preventing oxidization. Metallic cap 1 and metal base 3 are hermetically sealed by resistance welding. The sealed and air-tight interior is substituted by nitrogen or vacuumed so that age deterioration of light-emitting element or light-receiving element 6 is prevented.

However, the above conventional optical component hermetically seals each external draw-out electrode 4 to metal base 3 and thus requires a hole through which external draw-out electrode 4 penetrates. As a result, providing the through hole caused a cost increase, and filling of low melting-point glass 5 into the hole caused a further cost increase for manufacturing metal base 3.

Furthermore, the above conventional optical component uses metal wire 7 for electrically connecting an electrode of light-emitting element or light-receiving element 6 to external draw-out electrode 4. Due to the inductance of metal wire 7 and stray capacitance, high frequency signal transmission or high speed signal transmission is difficult.

SUMMARY OF THE INVENTION

An optical component of the present invention comprises a concave package provided by layering ceramic substrates; a groove section formed at a bottom face in this package; a light-receiving element or a light-emitting element provided in this groove section; a cover provided to cover an opening section of the package; and a lens formed at this cover. Forming the lens at the cover enables use of an inexpensive optical component, and the use of the package of layered ceramic substrates enables the provision of an optical component having a smaller size and a shorter height.

A method for manufacturing the optical component of the present invention controls the thickness of the fixed substrate to adjust the distance from a ball lens to the light-emitting element or the light-receiving element. This method can adjust the positioning in the height direction by the thickness of the fixed substrate, thus realizing a lower cost.

BRIEF DESCRIPTION OF THE DRAWINGS

FIG. 7A is a perspective view of a conventional optical component.

FIG. 7B is a cross-sectional view of the conventional optical component.

DESCRIPTION OF THE INVENTION

Hereinafter, an optical component in embodiments of the present invention will be described with reference to accompanying drawings.

EMBODIMENT 1

Figure 1A:
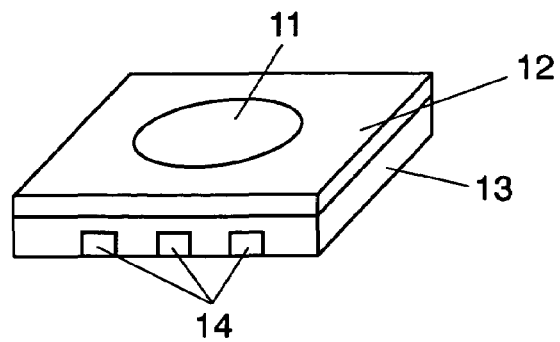
FIG. 1A is a perspective view of an optical component in Embodiment 1 of the present invention.
Figure 1B:
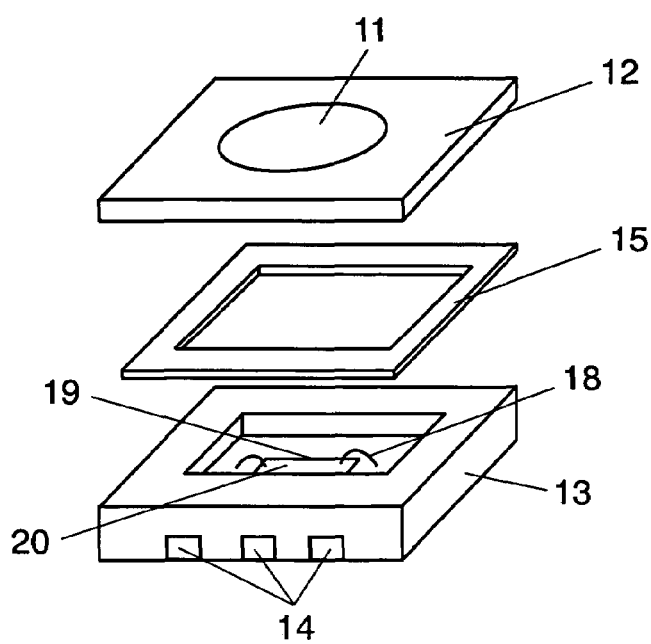
FIG. 1B is an exploded perspective view of the optical component in Embodiment 1 of the present invention.
Figure 1C:
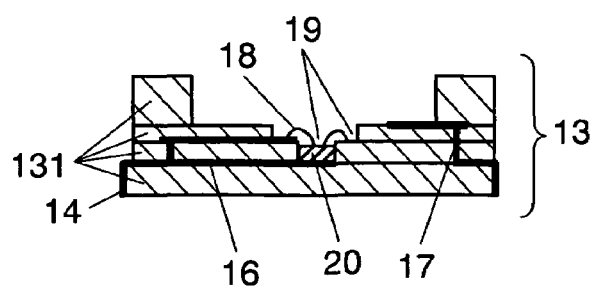
FIG. 1C is a cross-sectional view of a package in Embodiment 1 of the present invention.

FIGS. 1A and 1B show an optical component in Embodiment 1 of the present invention. FIG. 1C shows a package in Embodiment 1 of the present invention. The optical component in Embodiment 1 includes: lens 11; cover 12 in which lens 11 is formed; concave package 13 provided by layering ceramic substrates 131; external electrode 14 provided on an outer surface of package 13; seal ring 15 fixed between package 13 and cover 12; wiring 16 provided on each layer of ceramic substrate 131; through hole electrode 17 for connecting wirings 16 provided on respective layers to one another; wire 18; groove section 19; and light-receiving element or light-emitting element (hereinafter referred to as optical semiconductor element) 20. Details of lens 11 will be described with reference to FIGS. 2A–2E.

Concave package 13 is provided by layering ceramic substrates 131 having through hole electrodes 17 and wirings 16. An internal bottom face of concave package 13 includes groove section 19 having at least two steps. Optical semiconductor element 20 is mounted in groove section 19. An electrode (not shown) of this optical semiconductor element 20 and wiring 16 are connected by wire 18. Seal ring 15 is provided on a face of package 13 having a contact with cover 12. By seal ring 15, cover 12 and package 13 are sealed. The use of seal ring 15 allows the interior surrounded by package 13 and cover 12 to be sealed hermetically. Then, an external side face or a back face of package 13 is provided with external electrode 14 for providing external connection. Through hole electrode 17 is an interlayer connection electrode that is provided by filling a through bore formed in ceramic substrate 131 with conductive material. Through hole electrode 17 includes an interlayer connection electrode that penetrates through only a single layer of ceramic substrate 131 as well as an interlayer connection electrode that continuously penetrates through a plurality of ceramic substrates 131.

FIG. 1C shows an example in which concave package 13 is provided by layering four layers of ceramic substrates 131. In the interior of package 13, electrodes and wirings are layered. Each layer of wiring 16 layered together with ceramic substrate 131 is connected by through hole electrode 17 provided to penetrate through ceramic substrate 131. It is noted that ceramic substrate 131 preferably includes a material having a high heat conduction (e.g., aluminum nitride, silicon nitride) because heat generated in optical semiconductor element 20 can be radiated and thus deterioration of the characteristic can be reduced.

Package 13 is provided by layering green sheets, for example. Package 13 can be used for a surface mounting because wiring 16 formed in package 13 can provide connection to external electrode 14 at an outer side face or a back face of package 13 via through hole electrode 17. When package 13 provided by layering ceramic substrates 131 has a rectangular shape, optical semiconductor element 20 can be mounted on the package 13 such that a direction along which laser beam is polarized is aligned with a predetermined direction of package 13, thus the polarization direction of the beam can be observed from outside of package 13. As a result, connection of an optical fiber (not shown) or the like to package 13 becomes easy and simple.

When the difference of linear expansion coefficient between seal ring 15 and cover 12 is kept at $9 \times 10^{-7} K^{-1}$ or less, the thermal stress caused between seal ring 15 and cover 12 can be reduced and thus the reliability is improved. When the difference of linear expansion coefficient between package 13 and seal ring 15 is kept at $9 \times 10^{-7} K^{-1}$ or less, the thermal stress between the two can be reduced and thus the reliability is improved.

In the optical component according to this embodiment, external electrode 14, wiring 16, through hole electrode 17 or the like can be provided in ceramic substrate 131 to reduce the size of package 13. An optical path such as an optical fiber or a light guide is provided on lens 11 to transmit optical signals.

Optical semiconductor element 20 is mounted at groove section 19. In this case, groove section 19 has a shape that is substantially the same as an outer shape of optical semiconductor element 20 to be mounted. As a result, optical semiconductor element 20 can be engaged with groove section 19 and optical semiconductor element 20 can be positioned easily, thereby increasing the workability.

As shown in FIG. 1C, groove section 19 may include two or more steps. In this case, groove section 19 can accommodate optical semiconductor elements 20 having two or more types of shapes. In other words, using the same package 13 for various optical semiconductor elements 20 reduces the number of parts and thus the cost can be reduced.

An optical axis of lens 11 and a light-receiving face of a light-receiving element or a light-emitting face of a light-emitting element are arranged so that the optical axis is perpendicular to the face. This arrangement facilitates the positioning relative to an optical fiber (not shown) provided on lens 11 and can improve the coupling efficiency. When optical semiconductor element 20 is a light-emitting element such as an LED, lens 11 is preferably designed in consideration of a radiation angle and a focal point of the light-emitting element. Light-emitting elements to be used include LED, LD, and Vertical Cavity Surface Emitting Laser (VCSEL) elements. Among them, the use of a planar light emission semiconductor laser such as VCSEL is particularly favorable for realizing an optical component having a smaller size and a shorter height.

When optical semiconductor element 20 is a light-receiving element such as a PD, lens 11 is preferably designed in consideration of an amount of light entering the light-receiving face. When optical semiconductor element 20 is a PD, then lens 11 does not always require a beam condensing function and in some cases plane window may be used as lens 11 without problem. Specifically, lens 11 of this embodiment includes a planer lens. In order to reduce reflection at an interface, a main surface of lens 11 is desirably provided with an anti-reflection coating.

The interior of package 13 sealed in an air-tight manner provides a high reliability. Package 13 that is hermetically sealed and charged with nitrogen gas provides a further higher reliability.

For hermetically sealing cover 12 to package 13, a seam welding method or sealing by adhesive is available. When the seam welding is used, a flat face around the lens 11 must be provided with an electrode by deposition or the like. On the other hand, when adhesive, for example epoxy resin, is used, seal ring 15 can be omitted.

Figure 2A:
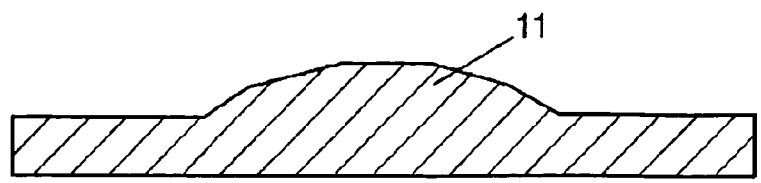
FIGS. 2A to 2E are cross-sectional views of a lens used for an optical component of the present invention.
Figure 2B:
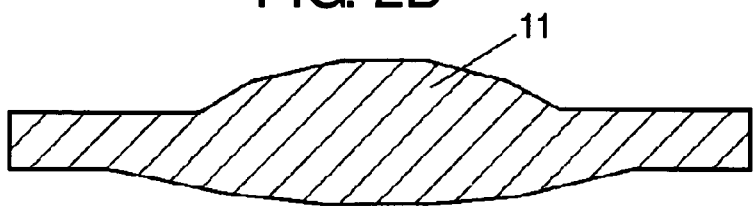
Figure 2C:
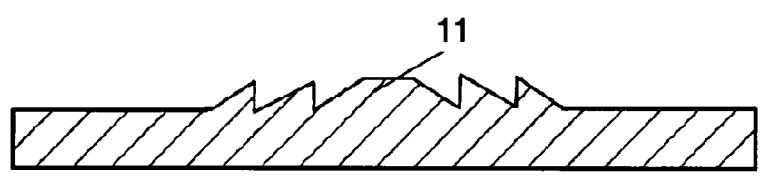
Figure 2D:
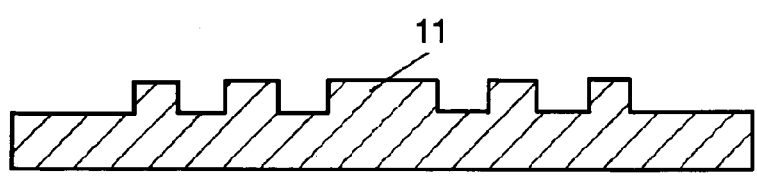
Figure 2E:
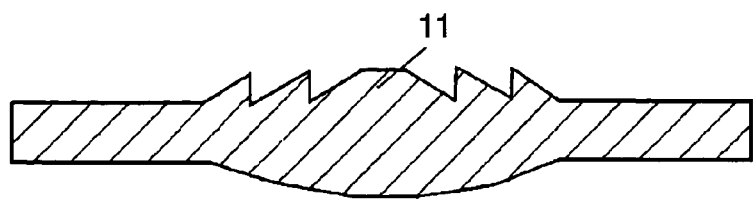

FIGS. 2A to 2E show cross-sectional views of various lenses 11 that can be used for the optical component of the present invention. FIGS. 2A and 2B show a refractive lens; FIG. 2C shows a diffractive lens; FIG. 2D shows a binary lens; and FIG. 2E shows a lens having the combination of a diffractive lens and a refractive lens, respectively.

Specifically, various lenses can be used such as a diffractive lens, a refractive lens, a lens having the combination thereof, and a lens having a diffractive lens at the top surface and having a refractive lens at the back surface. Among them, the use of a binary lens, a diffractive lens or the like is particularly favorable for realizing an element having a smaller size and a shorter height.

Materials for lens 11 include glass or resin. Among them, glass is particularly desirable as a material for lens 11 when the temperature-dependency of the refractive index or the reliability is important. On the contrary, resin is desirable when cost reduction is important.

Figure 3A:
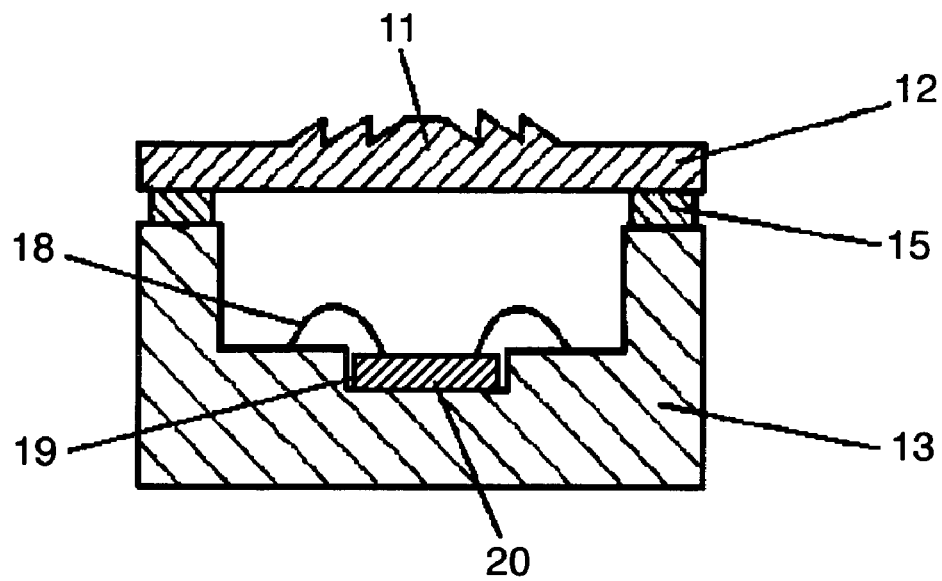
FIGS. 3A and 3B are cross-sectional views of another optical component of Embodiment 1.
Figure 3B:
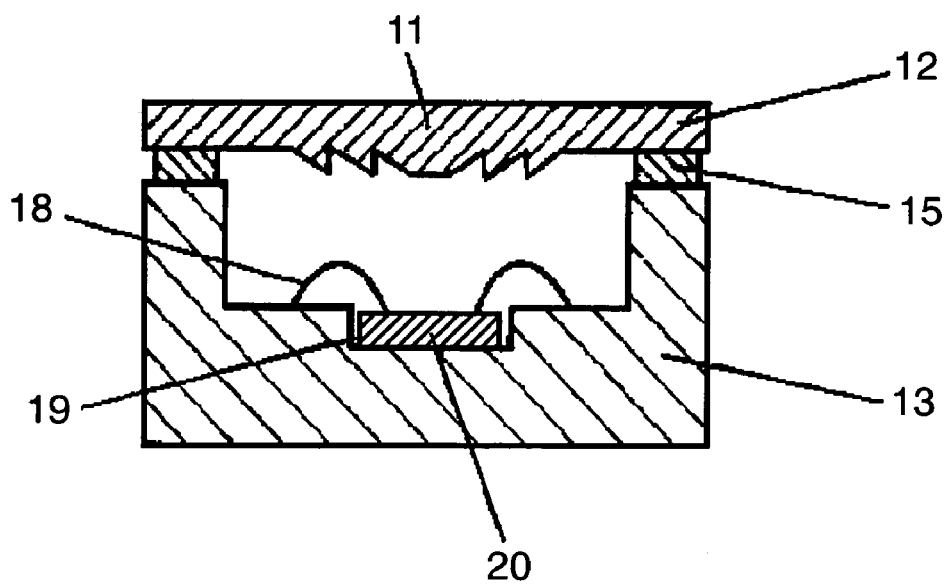

FIGS. 3A and 3B are cross-sectional views showing another optical component of the present invention. The optical component of FIG. 3A is an example in which a diffraction pattern of a diffractive lens is provided at a surface of cover 12 and is provided outside of package 13. In the optical component of FIG. 3B, a diffraction pattern is provided at a back face of cover 12 and is provided inside of package 13. The optical component of FIG. 3B is more preferable because it can prevent, when compared to the case of the optical component of FIG. 3A, dirt on the lens due to the dust in air stuck to the diffraction pattern. The structure of the optical component illustrated in FIG. 3B also provides a similar effect in other embodiments for using a diffractive lens.

As material for seal ring 15, Fe—Ni—Co alloy is generally used in consideration of the weldability. Seal ring 15 is brazed by silver or the like at an interface between package 13 and cover 12. When glass is used for cover 12, material for seal ring 15 is selected so that the linear expansion coefficient of cover 12 is as close to that of seal ring 15 as possible. When Fe—Ni—Co alloy is used for seal ring 15, for example, borosilicate glass is preferable for cover 12. Commercial products such as Kovar glass having a thermal expansion coefficient adjusted to Fe—Ni—Co alloy can be used as cover 12.

Figure 4A:
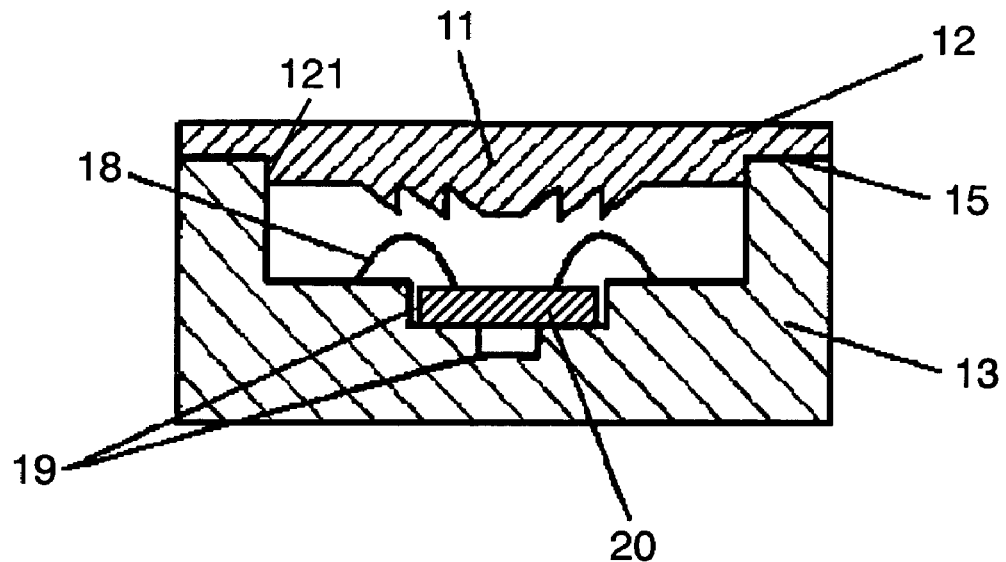
FIGS. 4A and 4B are cross-sectional views of another optical component of Embodiment 1.
Figure 4B:
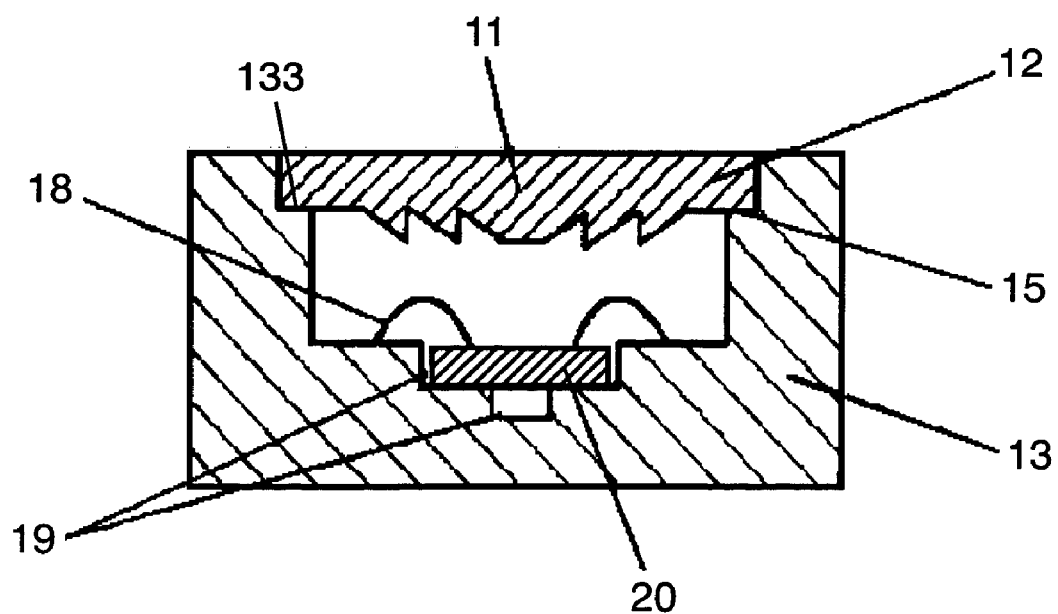

FIGS. 4A and 4B are cross-sectional views illustrating another optical component of Embodiment 1. As shown in FIG. 4A, cover 12 includes step 121 at an interface between cover 12 and package 13 so that cover 12 can be engaged with package 13. Alternatively, package 13 includes step 133 at an interface between cover 12 and package 13 as shown in FIG. 4B so that cover 12 can be engaged with package 13. By providing steps 121 and 133, optical semiconductor element 20 can be positioned relative to lens 11 formed in cover 12 in an easier manner and the hermetic sealing effect is improved. These steps 121 and 133 may have two or more steps. Although the examples in FIGS. 4A and 4B show that only one of cover 12 or package 13 includes the step, both of cover 12 and package 13 may include such steps. Cover 12 or package 13 may include two or more steps.

Methods for providing a diffractive lens by processing glass or resin include a dry etching method, a cutting processing method, and a press molding method.

When glass is used for cover 12 having lens 11, such glass is preferably used that includes at least $SiO_2$ and $B_2O_3$ and that includes at least one of $Na_2O$ or $K_2O$. The reason is that the use of such glass requires a lower cost and causes a smaller difference in linear expansion coefficient, thus providing an improved reliability.

As fluorine crown glass including at least $SiO_2$, $B_2O_3$ and fluorine or fluorophosphate glass including $P_2O_5$ and fluorine has a lower softening temperature, working temperature is lowered and lower cost is realized by using those glasses.

EMBODIMENT 2

Next, embodiment 2 of the present invention will be described with reference to FIGS. 5A to 5D. Hereinafter, an optical component of embodiment 2 will be described according to the manufacturing steps.

Figure 5A:
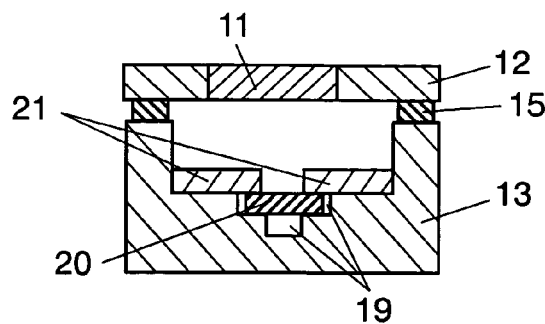
FIG. 5A is a cross-sectional view illustrating an optical component in Embodiment 2 of the present invention.
Figure 5B:
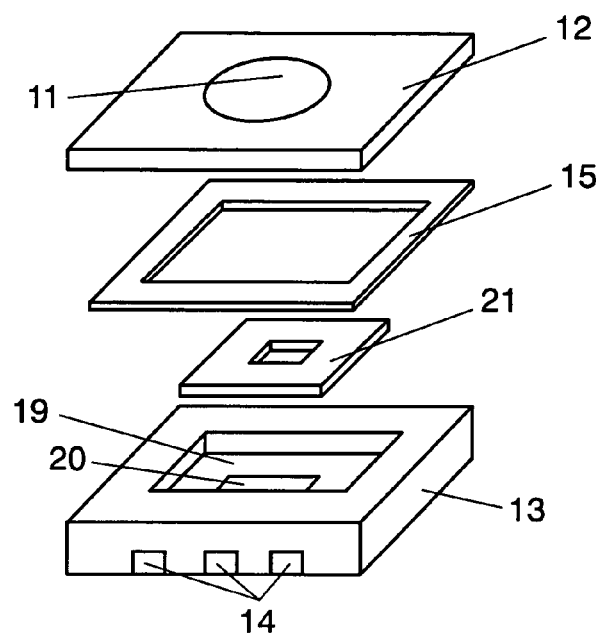
FIG. 5B is an exploded perspective view of an example of the optical component in Embodiment 2 of the present invention.
Figure 5C:
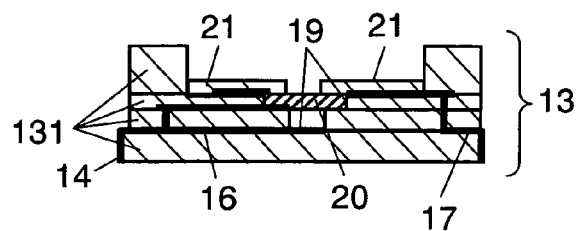
FIG. 5C is a cross-sectional view of a package used for the optical component in Embodiment 2 of the present invention.

As shown in FIGS. 5A to 5C, concave package 13 is provided by layering ceramic substrates 131 having through hole electrode 17 and wiring having at least two steps is provided. When groove section 19 is mounted with light-receiving element or light-emitting element (hereinafter referred to as optical semiconductor element) 20, the depth of groove section 19 is adjusted such that the internal bottom face of package 13 and a top face of optical semiconductor element 20 reach substantially the same height. Optical semiconductor element 20 is sandwiched between fixed substrate 21 having a wiring at least at the lower face and package 13. Then, an electrode of optical semiconductor element 20 is connected to an electrode provided at each layer of ceramic substrate 131 or wiring 16 via a wiring provided at fixed substrate 21. Next, seal ring 15 is placed at the top face of package 13, and cover 12 having lens 11 and package 13 are sealed hermetically via seal ring 15. Package 13 also includes external electrode 14 for external connection at the external side face or at the back face. Fixed substrate 21 provided with a window having a size that is larger than the size of a light-receiving section of the light-receiving element or the size of a light-emitting section of the light-emitting element and that is smaller than the outer shape of the entirety of optical semiconductor element 20. When optical semiconductor element 20 is a light-emitting element, light is externally emitted through this window. When optical semiconductor element 20 is a light-receiving element, light reaches the light-receiving element through the window.

The optical component of Embodiment 2 having the structure as described above provides a higher heat radiation effect because optical semiconductor element 20 is fixedly sandwiched between fixed substrate 21 and package 13 and thus an area in which optical semiconductor element 20 has a contact with fixed substrate 21 or package 13 can be increased. The optical component of embodiment 2 having the structure as described above also can reduce the variation in wiring lengths and a conductor resistance value, thereby stabilizing and improving the high frequency characteristics.

Figure 5D:
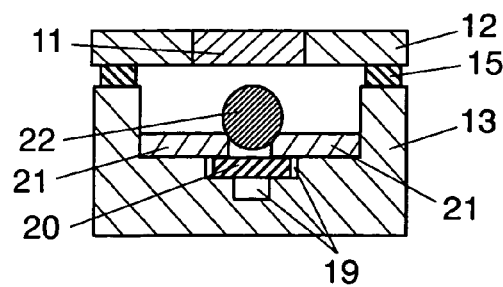
FIG. 5D is a cross-sectional view of the optical component in Embodiment 2 of the present invention.

As shown in FIG. 5D, ball lens 22 may be provided on fixed substrate 21. When an optical component has ball lens 22, the optical component requires a lower cost because the thickness of fixed substrate 21 can be controlled to easily adjust the interval between light-emitting element or light-receiving element 20 and ball lens 22.

Figure 6A:
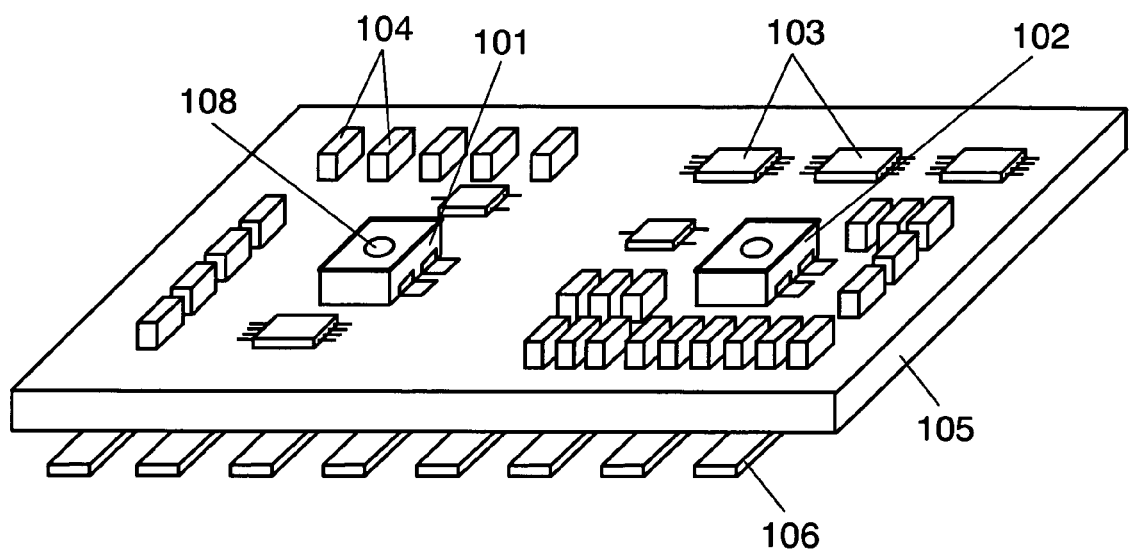
FIG. 6A is a perspective view of an optical link module using the optical component of the present invention.
Figure 6B:
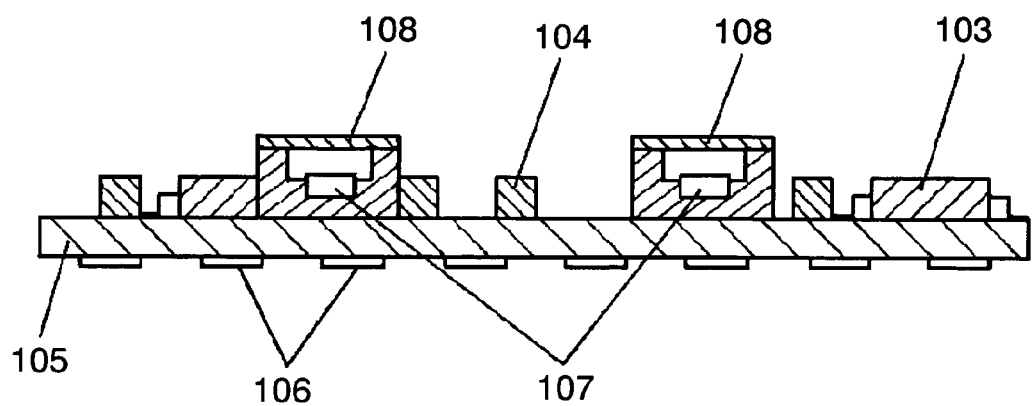
FIG. 6B is a cross-sectional view of the optical link module using the optical component of the present invention.

FIGS. 6A and 6B illustrate an optical link module using the optical component of the present invention. The optical link module includes: optical components 101 and 102; a driver IC for driving optical components 101 and 102; LSI 103 (e.g., preamplifier, main amplifier); a chip resistor for providing a circuit; discrete components 104 (e.g., layered ceramic capacitors); printed wiring board 105 for mounting them; external draw-out electrode 106; optical semiconductor element 107; and lens 108. FIGS. 6A and 6B show an example in which lens 108 is integrated with a cover.

The optical link module having the above-described structure and using the optical component of the present invention can use low cost optical components of the present invention and can realize a smaller size and a shorter height as the optical link module. The optical link module of the present embodiment attained 20% reduction in occupying area and 30% reduction of the height as compared with the conventional module. In addition, as the optical components of the present invention have external electrodes on the surface, surface mounting is available and further reduction of the height as the optical link module is possible.

As described above, the present invention provides an optical component having a concave package provided by layering ceramic substrates, a groove section provided at a bottom face in this package, an optical semiconductor element provided in this groove section, a cover provided to cover an opening section of the package and a lens formed at this cover. The lens formed at the cover can provide an inexpensive optical component while the use of the package by layered ceramic substrates can realize an optical component having a smaller size and a shorter height.

What is claimed is:

1. An optical component, comprising:
   a concave package including layered ceramic substrates;
   a groove section formed at a bottom face of the package;
   an optical semiconductor element housed in the groove section;
   a cover arranged to cover an opening section of the package;
   a lens formed at the cover;
   a fixed substrate housed in the package and fixing the optical semiconductor element to the groove section; and
   a ball lens fixed to a window of the fixed substrate,
   wherein the thickness of the fixed substrate can be changed depending on an optical path.

2. A method for manufacturing an optical component, wherein the optical component comprises:
a concave package,
a groove section formed at a bottom face of the package,
an optical semiconductor element housed in the groove section,
a cover for covering an opening section of the package,
a lens formed in the cover,
a fixed substrate that is housed in the package and that has a window, and
a ball lens fixed to the window of the fixed substrate,
wherein the method comprises:
adjusting a distance from the ball lens to the optical semiconductor element; and
wherein the distance is adjusted by controlling the thickness of the fixed substrate.

3. An optical component, comprising:
a concave package including layered ceramic substrates;
a groove section formed at a bottom face of the package;
an optical semiconductor element housed in the groove section;
a cover arranged to cover an opening section of the package;
a lens formed at the cover;
a fixed substrate housed in the package and fixing the optical semiconductor element to the groove section; and
a window having a shape that is smaller than an outer shape of the optical semiconductor element and that is larger than the size of a light-receiving section or a light-emitting section of the optical semiconductor element.

4. The optical component according to claims 3, further comprising:
an electrode provided at a bottom face of the package;
an electrode of the optical semiconductor element; and
a wiring of the fixed substrate,
wherein the wiring of the fixed substrate connects the electrode of the optical semiconductor element to the electrode provided at a bottom face in the package.

5. The optical component according to claim 3, further comprising:
interlayer wirings sandwiched by the layered ceramic substrates;
a through hole electrode formed in the ceramic substrates to connect the interlayer wirings to each other; and
an external electrode provided at least at an external side face or at a bottom face of the package,
wherein the interlayer wirings are connected to the external electrode.

6. The optical component according to claim 3, wherein the groove section further includes two or more steps.

7. The optical component according to claim 3, wherein the groove section has a shape that is similar to and larger than the shape of the optical semiconductor element.

8. The optical component according to claim 3, wherein the light-receiving face or the light-emitting face of the optical semiconductor element is provided to be perpendicular to an optical axis of the lens.

9. The optical component according to claim 3, wherein the lens is a diffractive lens.

10. The optical component according to claim 9, wherein a diffraction pattern of the diffractive lens is formed at a face opposed to the optical semiconductor element.

11. The optical component according to claim 3, further comprising a step formed at a face of the package having contact with the cover, wherein the step is engaged with the cover.

12. The optical component according to claim 3, further comprising a step at a side face of the cover,
wherein the step is engaged with an opening section of the package.

13. The optical component according to claim 3, wherein the difference in linear expansion coefficient between the package and the lens is $9 \times 10^{-7} K^{-1}$ or less.

14. The optical component according to claim 3, wherein the lens is made of glass material that includes at least $SiO_2$ and $B_2O_3$ and that includes at least either $Na_2O$ or $K_2O$.

15. The optical component according to claim 3, wherein the lens is made of fluorine crown glass including at least $SiO_2$, $B_2O_3$ and fluorine.

16. The optical component according to claim 3, wherein the lens is made of fluorophosphate glass including $P_2O_5$ and fluorine.

* * * * *